United States Patent
Gao et al.

(10) Patent No.: US 11,275,409 B2
(45) Date of Patent: Mar. 15, 2022

(54) DISPLAY SUBSTRATE AND DISPLAY DEVICE

(71) Applicant: BOE TECHNOLOGY GROUP CO., LTD., Beijing (CN)

(72) Inventors: Biao Gao, Beijing (CN); Shiming Shi, Beijing (CN); Zhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/888,151

(22) Filed: May 29, 2020

(65) Prior Publication Data

US 2021/0165456 A1   Jun. 3, 2021

(30) Foreign Application Priority Data

Dec. 2, 2019  (CN) .......................... 201922131550.8

(51) Int. Cl.
   *G06F 1/16*    (2006.01)
   *H01L 51/00*   (2006.01)
   *G09F 9/30*    (2006.01)

(52) U.S. Cl.
   CPC .......... *G06F 1/1652* (2013.01); *G06F 1/1609* (2013.01); *G09F 9/301* (2013.01); *H01L 51/0097* (2013.01)

(58) Field of Classification Search
   CPC ................................................. G06F 1/1652
   See application file for complete search history.

(56) References Cited

U.S. PATENT DOCUMENTS

| | | | | |
|---|---|---|---|---|
| 9,107,287 B2* | 8/2015 | Ryu | ...................... | H05K 5/0017 |
| 9,348,362 B2* | 5/2016 | Ko | ...................... | G06F 1/1626 |
| 9,379,355 B1* | 6/2016 | Lee | ...................... | B32B 5/18 |
| 10,254,574 B2* | 4/2019 | Tokuda | ...................... | H01L 27/3258 |
| 10,359,809 B2* | 7/2019 | Kwak | ...................... | G06F 1/1692 |
| 10,553,135 B2* | 2/2020 | Lee | ...................... | G09F 9/301 |
| 2010/0164973 A1* | 7/2010 | Huitema | ...................... | G06F 1/165 345/581 |
| 2013/0002133 A1* | 1/2013 | Jin | ...................... | G06F 1/1626 313/511 |
| 2013/0058063 A1* | 3/2013 | O'Brien | ...................... | G06F 1/1652 361/807 |
| 2013/0081756 A1* | 4/2013 | Franklin | ...................... | B29C 53/04 156/221 |
| 2014/0126228 A1* | 5/2014 | Lee | ...................... | F21V 21/00 362/382 |
| 2014/0217382 A1* | 8/2014 | Kwon | ...................... | H01L 51/5246 257/40 |

(Continued)

*Primary Examiner* — Adrian S Wilson
(74) *Attorney, Agent, or Firm* — Nath, Goldberg & Meyer; Joshua B. Goldberg

(57) ABSTRACT

The present disclosure provides a display substrate, which includes a display portion, a binding portion and a bendable portion connected between the display portion and the binding portion, wherein the binding portion is located on a side of the display portion distal to a light exit direction of the display substrate; wherein, a support layer is provided on the inner side of the bendable portion, and the support layer extends from one end of the bendable portion close to the display portion to one end of the bendable portion close to the binding portion of the bendable portion along an inner side edge of the bendable portion; and the bendable portion is bent around a bending axis.

16 Claims, 5 Drawing Sheets

(56) References Cited

U.S. PATENT DOCUMENTS

| | | | |
|---|---|---|---|
| 2014/0240985 A1* | 8/2014 | Kim | H05K 1/028 |
| | | | 362/249.04 |
| 2014/0247405 A1* | 9/2014 | Jin | G06F 1/1643 |
| | | | 349/12 |
| 2015/0021570 A1* | 1/2015 | Kim | H01L 51/5293 |
| | | | 257/40 |
| 2015/0036300 A1* | 2/2015 | Park | G02F 1/1345 |
| | | | 361/749 |
| 2016/0087024 A1* | 3/2016 | Son | H01L 51/0097 |
| | | | 257/40 |
| 2016/0204366 A1* | 7/2016 | Zhang | H01L 27/326 |
| | | | 257/40 |
| 2016/0293869 A1* | 10/2016 | Saeki | H01L 27/3276 |
| 2019/0081256 A1* | 3/2019 | Kim | H01L 51/56 |
| 2019/0131565 A1* | 5/2019 | Kwon | G06F 1/1601 |
| 2019/0280244 A1* | 9/2019 | Kwon | H01L 51/5253 |

\* cited by examiner

DISPLAY SUBSTRATE AND DISPLAY DEVICE

CROSS REFERENCE TO RELATED APPLICATIONS

The present application claims the priority of the Chinese Patent Application No. 201922131550.8 filed on Dec. 2, 2019, the content of which is incorporated herein by reference in its entirety.

TECHNICAL FIELD

The present disclosure relates to the field of display technology, and in particular to a display substrate and a display device.

BACKGROUND

As a novel light emitting device, an Organic Light-Emitting Diode (OLED) has been greatly researched and applied in the field of display technology. Because the OLED is flexible, a display panel with a narrow frame, foldable property and other characteristics becomes the mainstream of a current product, and has a large development space.

SUMMARY

The present disclosure provides a display substrate including a display portion, a binding portion and a bendable portion between the display portion and the binding portion, the binding portion is on a side of the display portion distal to a light exit side of the display substrate; a support layer is on an inner side of the bendable portion, and the support layer extends from one end of the bendable portion close to the display portion to one end of the bendable portion close to the binding portion of the bendable portion and extends along an edge on the inner side of the bendable portion; and the bendable portion is bent around a bending axis.

In some embodiments, a cross-sectional shape of the bendable portion in a plane perpendicular to the bending axis is a partial circular ring, and an intersection point between the bending axis and the plane is a circle center of a circular ring where the bent bendable portion is located.

In some embodiments, a cross-sectional shape of the support layer in a plane perpendicular to the bending axis is a partial circular ring.

In some embodiments, the support layer covers an entire surface on the inner side of the bendable portion.

In some embodiments, a material of the support layer includes a curing adhesive cured by ultraviolet light UV.

In some embodiments, the support layer includes a plurality of support strips arranged along the edge on the inner side edge of the bendable portion from the one end of the bendable portion close to the display portion to the one end of the bendable portion close to the binding portion; in a cross section of the support strips in a plane perpendicular to the bending axis, a width of each of the support strips gradually increases from an end of the support strip proximal to the bending axis to an end of the support strip distal to the bending axis.

In some embodiments, a cross-sectional shape of the support strip in a plane perpendicular to the bending axis is trapezoidal.

In some embodiments, a cross-sectional shape of the support strip s in a plane perpendicular to the bending axis is semicircular.

In some embodiments, the display substrate further includes a back film, the back film includes a first layer of back film on a surface of the display portion proximal to the binding portion and a second layer of back film on a surface of the binding portion proximal to the display portion, and at least one end of the support layer abuts against the back film.

In some embodiments, the display substrate further includes a back film, the back film includes a first layer of back film on a surface of the display portion proximal to the binding portion and a second layer of back film on a surface of the binding portion proximal to the display portion, and both ends of the support layer abut against the back film.

In some embodiments, the end of the support layer abutting against the back film has a same thickness as the back film.

In some embodiments, the display substrate further includes a spacer block between the first layer of back film and the second layer of back film, the spacer block is provided with a chamfer structure at one end of the spacer block proximal to the binding portion, and the chamfer structure is on one side of the spacer block proximal to the bendable portion.

In some embodiments, the chamfer structure is a circular bead of R0.5 to R1 or a 45 degree chamfer of C0.5 to C1.

The present disclosure provides a display device including the aforementioned display substrate, and a flexible cover plate which is on the display substrate at a light exit side of the display substrate.

BRIEF DESCRIPTION OF DRAWINGS

Drawings are included to provide a further understanding of the present disclosure and constitute a part of this specification, explain the present disclosure together with the following detail description of embodiments, but not limit the present disclosure. In the drawings:

FIG. 2b is a schematic diagram illustrating the unfolded display substrate of FIG. 2a;

FIG. 3b is a schematic diagram illustrating the unfolded display substrate of FIG. 3a;

DETAIL DESCRIPTION OF EMBODIMENTS

The following detailed description of embodiments of the present disclosure will be given in details below in conjunction with the accompanying drawings. It should be understood that, the detailed description of the embodiments are only used to illustrate and explain but not limit the present disclosure.

At present, in order to achieve the narrow frame, a portion of a display substrate for connecting driving circuits and related circuits is bent to a back side of the display substrate. A region inside an arc of a bendable portion is generally hollow, and may be not supported by any substance, so that the region may be greatly deformed when being applied with an external force, and cracks and other problems may be caused after the region is frequently pressed, thereby degrading a display effect.

At present, in order to achieve the flexibility of a display device, a glass cover plate is generally replaced with a flexible cover plate to protect the display substrate. However, the flexible cover plate has a weaker resistance to external forces, compared to the glass cover plate. After being pressed, the flexible cover plate may contact the bendable portion of the display substrate and transmit a pressure to the bendable portion of the display substrate, so that the display substrate is pressed by the external force to deform, and cracks and other problems may be caused, thereby degrading the display effect.

Figure 1A:
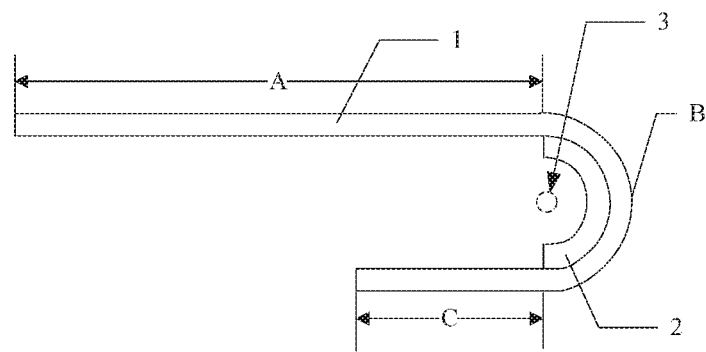
FIGS. 1a to 1b each are a schematic structural view of a display substrate according to an embodiment of the present disclosure.
Figure 1B:
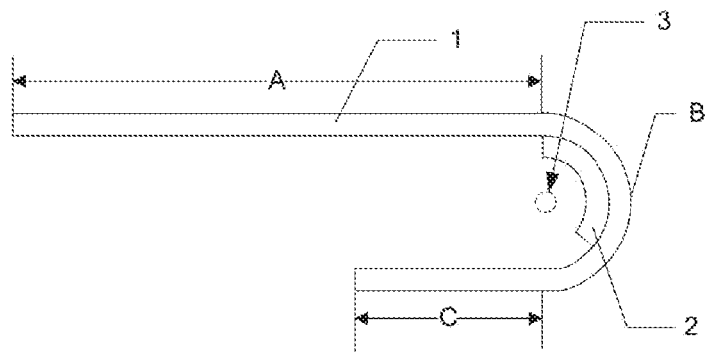

The present disclosure provides a display substrate. FIGS. 1a to 1b each are a schematic structural view of the display substrate according to an embodiment of the present disclosure. As shown in FIGS. 1a to 1b, the display substrate 1 includes a display portion A, a binding portion C, and a bendable portion B connected between the display portion A and the binding portion C. The binding portion C is located on a side of the display portion A distal to a light exit side of the display substrate. A support layer 2 is provided on an inner side of the bendable portion B, and the support layer 2 extends from one end of the bendable portion B abutting the display portion to the other end of the bendable portion B abutting the binding portion C.

Specifically, the binding portion C is used for binding a driving chip or a driving circuit board, and the bendable portion B can be bendable, so that the binding portion C departs from the light exit side of the display substrate due to the bendable portion B being bent, so as to provide the driving chip or the driving circuit board on the back side of the display substrate. In an embodiment of the present disclosure, the support layer 2 may cover an entire surface on an inner side of the bendable portion B, or may cover a part of the entire surface on the inner side of the bendable portion B, as long as it may support the bendable portion B when the bendable portion B is subjected to an external pressure. In an embodiment of the present disclosure, the support layer 2 covers the entire surface on the inner side of the bendable portion B, so that the support layer 2 may achieve a better support strength. The inner side of the bendable portion B may refer to a side of the bendable portion B towards which the bendable portion B is bent, i.e., a left side of the bendable portion B in FIG. 1, that is, a side of the bendable portion B proximal to the display portion A and the binding portion C after the bendable portion B is bent. The support layer 2 may be made of a curing adhesive. The curing adhesive may be formed by curing a colloid with ultraviolet light (UV). In an embodiment of the present disclosure, the support layer 2 may be used to protect circuit traces in the bendable region of the display substrate and prevent the display substrate from being broken.

By adopting the display substrate of the embodiment of the present disclosure, the support layer 2 is provided on the inner side of the bendable portion B, and when the bendable portion B is pressed by external forces, the support layer 2 may support the bendable portion B to prevent the bendable portion B from deforming, thereby improving a quality of the display substrate.

The structure of the display substrate according to the embodiment of the present disclosure will be described in detail with reference to FIGS. 1a to 6c. Specifically, as shown in FIG. 1a, the bendable portion B has an arc-shaped structure bending around a bending axis 3, and the cross section of the support layer 2 on the plane perpendicular to the bending axis 3 is circular ring-shaped. The bending axis 3 is not an actual axis, but is an axis at a center of a circle where the bendable portion B is located. Specifically, the bending axis 3 is an axis perpendicular to a paper surface direction of FIGS. 1 and 2a and through the center of the circle where the bendable portion B is located.

However, the present disclosure is not limited thereto. The bendable portion B is a curved surface extending from one end of the display portion A to one end of the binding portion C, and the supporting portion 2 is provided on the inner side of the supporting portion 2 proximal to the display portion A and the binding portion C. For example, the supporting portion 2 may be a small part of a circular ring, as shown in FIG. 1b.

Figure 2A:
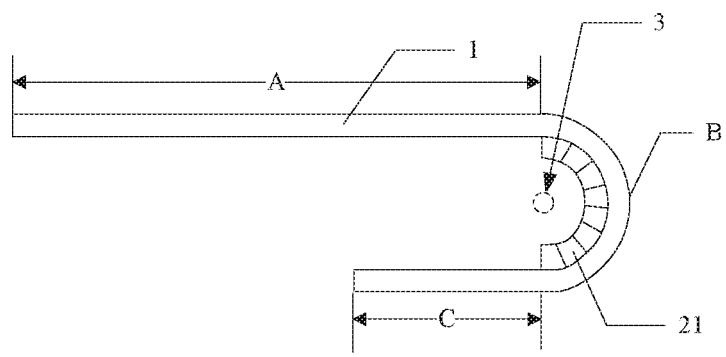
FIG. 2a is a schematic view of a first structure of a support layer according to an embodiment of the present disclosure.
Figure 2B:
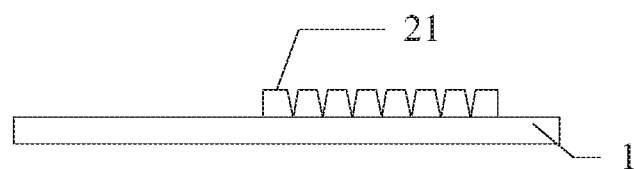
Figure 3A:
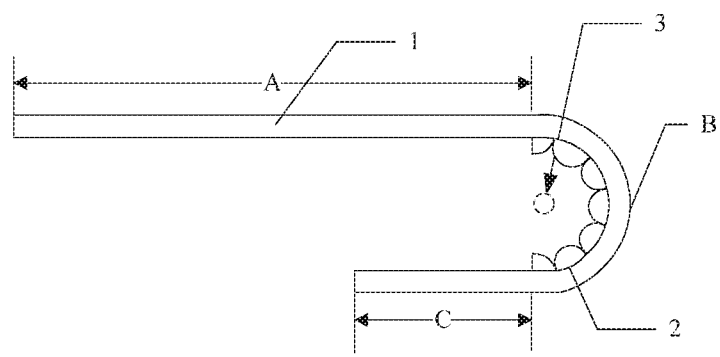
FIG. 3a is a schematic view of a second structure of a support layer according to an embodiment of the present disclosure.
Figure 3B:
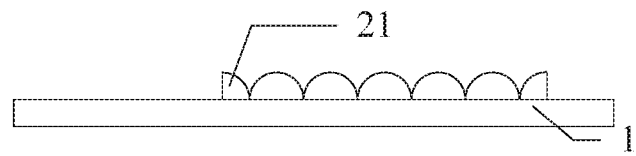

FIG. 2a is a schematic view of a first structure of a support layer 2 according to an embodiment of the present disclosure, FIG. 2b is a schematic view of the unfolded display substrate of FIG. 2a, FIG. 3a is a schematic view of a second structure of the support layer 2 according to another embodiment of the present disclosure, and FIG. 3b is a schematic view of the unfolded display substrate of FIG. 3a.

As shown in FIGS. 2a to 3b, in some embodiments, the support layer 2 includes a plurality of support strips 21 which extend along the bending axis 3. From one end (the top end of the support strips 21 in FIGS. 2b and 3b) of the support strips 21 distal to the bendable portion B to one end (the bottom end of the support strips 21 in FIGS. 2b and 3b) of the support strips 21 proximal to the bendable portion B, the width of the support strips 21 is gradually increased, so that there may be a certain gap between adjacent ends of the plurality of support strips 21 distal to the bendable portion B, thereby facilitating the bending of the bendable portion B, forming a more natural arc, simplifying a bending path, and reducing pulling forces in a bending process.

In an embodiment of the present disclosure, the plurality of support strips 21 may be arranged along a direction from one end of the bendable portion B abutting the display portion A to one end of the bendable portion B abutting the binding portion C. The width of the support strip 21 may refer to the dimension of the support strip 21 in the horizontal direction as shown in FIG. 2b or 3b.

In an embodiment of the present disclosure, the cross section of the support strip 21 on a plane perpendicular to its extending direction may be trapezoidal (as shown in FIGS. 2a and 2b) or semicircular (as shown in FIGS. 3a and 3b). The trapezoidal and semicircular cross sections may be formed by performing coating and curing at the same time with a smaller glue valve. The support strip 21 of a trapezoid as shown in FIGS. 2a and 2b is formed by using an adhesive coating mold, and the support strip 21 of a semicircle as shown in FIGS. 3a and 3b is formed by using a specific spray head.

In other embodiments, the cross section of the support strip 21 on the plane perpendicular to its extending direction may also be other shapes, which is not limited herein, as long as from the end of the support strip 21 distal to the bendable portion B to the end of the support strip 21 proximal to the bendable portion B, the width of the support strip 21 is gradually increased, so that there may be a certain gap between adjacent ends of the plurality of support strips 21 distal to the bendable portion B, to provide support for the bendable portions B.

In the embodiment shown in FIGS. 2a and 2b, the cross section of the support strip 21 on the plane perpendicular to its extending direction is trapezoidal, wherein the number of the support strips 21 and the inclination angle of the oblique sides of the support strips 21 may be determined according to actual needs, which is not limited herein.

Figure 4:
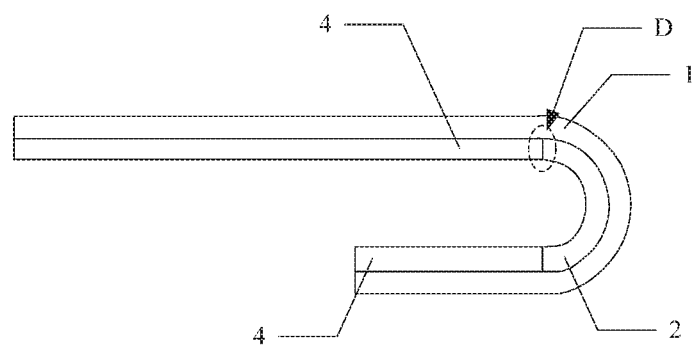
FIG. 4 is a schematic structural view of a display substrate in which back films and the support layer abutting against each other according to an embodiment of the present disclosure.

FIG. 4 is a schematic structural diagram of a display substrate in which a back film and the support layer abut against each other according to an embodiment of the present disclosure. As shown in FIG. 4, the display substrate further includes a back film 4 having a first layer of back film and a second layer of back film respectively provided on a surface of the display section A proximal to the binding section C and a surface of the binding section C proximal to the display section A, at least one end of the support layer 2 abuts against the back film 4. The main material of the back film 4 includes polyimide. In an embodiment of the present disclosure, the back film 4 may be used to provide support and protection for the entire display substrate, preventing its back surface from being scratched.

Specifically, as shown at a position D in FIG. 4, at least one end of the support layer 2 may abut against the back film 4, that is, one end of the support layer 2 close to the display portion A or the support layer 2 close to the binding section C abuts against the back film 4. The support layer 2 and the back film 4 abut against each other, so that the height difference between the back film 4 and the display substrate 1 may be reduced, the problem of stress concentration at the position D is relieved, and the display substrate 1 is prevented from being damaged. It is understood that, in an embodiment of the present disclosure, in the case where the support layer 2 covers the entire surface on the inner side of the bendable portion B, both ends of the support layer 2 may abut against the back film 4, thereby simultaneously reducing the height difference between the back film 4 provided on the display portion A and the display substrate 1 and the height difference between the back film 4 provided on the binding portion C and the display substrate 1. Further, the thickness of the end of the support layer 2 abutting against the back film 4 may be made the same as the thickness of the back film 4, thereby eliminating the height difference between the back film 4 and the display substrate 1. In other embodiments of the present disclosure, when being unfolded, the support layer 2 has the same thickness as that of the back film 4.

Figure 5A:
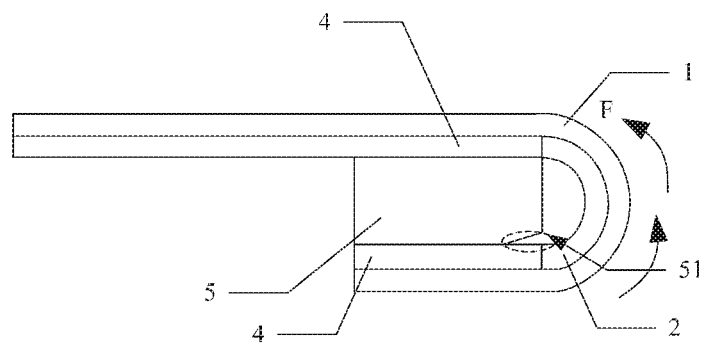
FIG. 5a is a schematic diagram of a first chamfer structure of a spacer block of the display substrate according to an embodiment of the present disclosure.
Figure 5B:
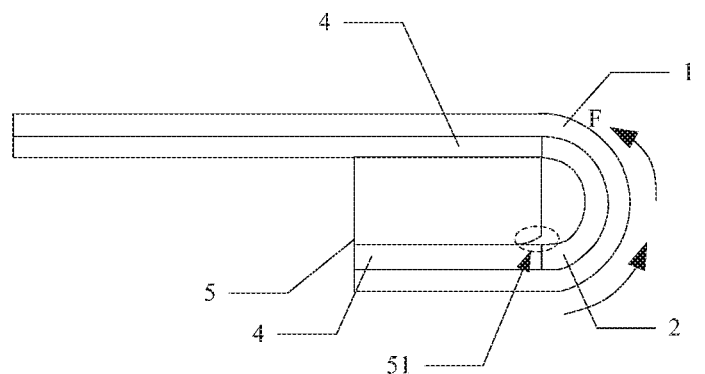
FIG. 5b is a schematic diagram of a second chamfer structure of a spacer block of the display substrate according to an embodiment of the present disclosure.

FIG. 5a is a schematic diagram of a first chamfer structure of a spacer block of the display substrate according to an embodiment of the present disclosure; FIG. 5b is a schematic diagram of a second chamfer structure of a spacer block of the display substrate according to an embodiment of the present disclosure.

In some embodiments, as shown in FIGS. 5a and 5B, the display substrate further includes a spacer block located between the two layers of back film, one end of the spacer block 5 close to the binding portion C has a chamfer structure 51, and the chamfer structure 51 is disposed on one side of the spacer block 5 proximal to the bendable portion B. The spacer block 5 may be made of a FOAM adhesive, such as polyethylene terephthalate (PET) with added adhesive, that is, adhesive is applied to upper and lower sides of the PET, so that the spacer block 5 and the back film 4 are adhered together. In one embodiment of the present disclosure, the spacer block 5 may be used to support and fix the arc region of the bendable display substrate and maintain the appearance of the arc.

Figures 5C, 5D:
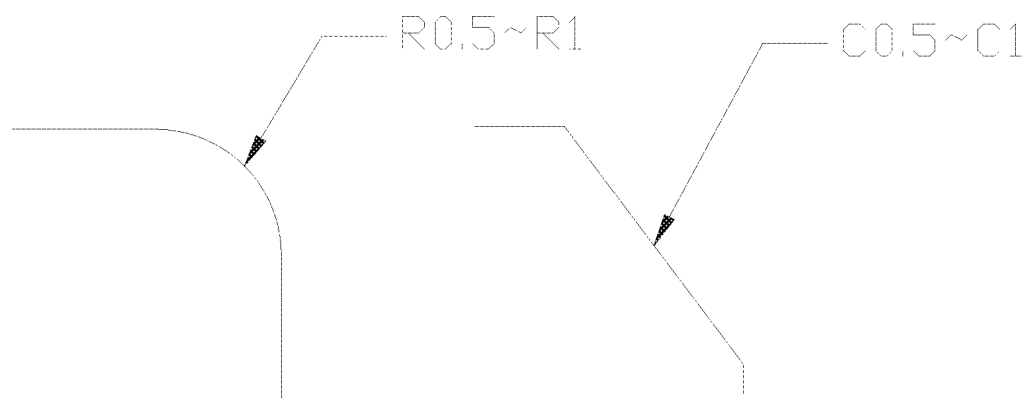
FIGS. 5c and 5d are schematic diagrams of specific examples of the two chamfer structures according to an embodiment of the present disclosure.

Specifically, the display portion A may be folded or unfolded along the bending axis, and after being folded along the bending axis, two parts of the display substrate positioned at two sides of the bending axis may be folded together, so that a display area of the display substrate is reduced; the unfolded display substrate may have a larger display area, such that the display effect may be improved. During the folding process of the display substrate, misplacement may occur between a base substrate and the back film of the display substrate. As shown in FIG. 5a, during the folding process of the display substrate, the display substrate moves relative to the back film 4 disposed on the display portion A in the direction of arrow F in FIG. 5a, which causes the spacer block 5 to apply stress concentration on one end of the support layer 2 close to the binding portion C, and may cause fatigue and failure on one end of the support layer 2 close to the binding portion C for a long time. In an embodiment of the present disclosure, the chamfer structure 51 is disposed at one end of the spacer block 5 close to the binding portion C and one side of the spacer block 5 close to the bendable portion B, so as to release stress concentration therein and avoid failure of one end of the support layer 2 close to the binding portion C. As shown in FIG. 5a, the chamfer structure 51 may be a triangular chamfer structure, that is, as shown in FIG. 5d, a 45 degree chamfer of C0.5 (a side length of 0.5 mm) to C1 (a side length of 1 mm). Alternatively, as shown in FIG. 5b, the chamfer structure 51 may be a circular bead, that is, as shown in FIG. 5c, a circular bead from R0.5 (a radius of 0.5 mm) to R1 (a radius of 1 mm).

Figure 6A:
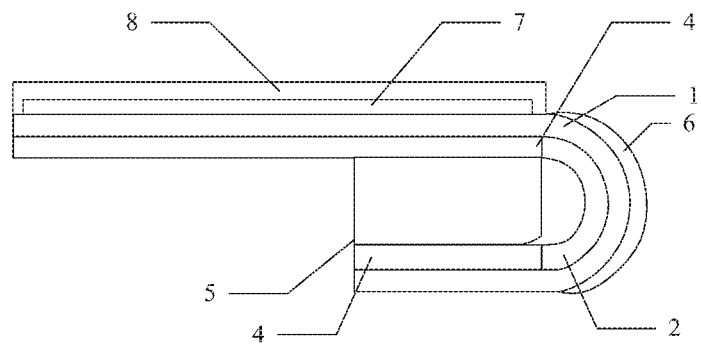
FIGS. 6a to 6c each are a schematic structural view of a display substrate according to an embodiment of the present disclosure.
Figure 6B:
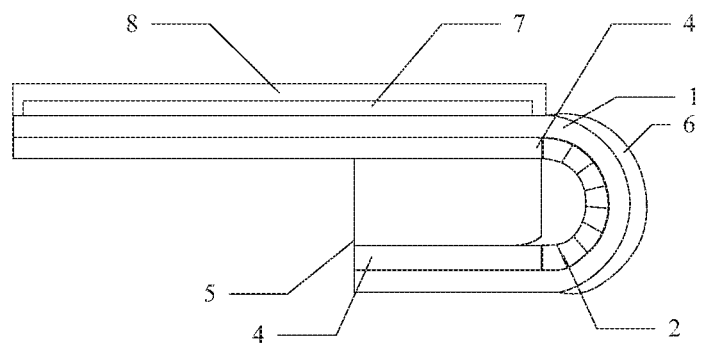
Figure 6C:
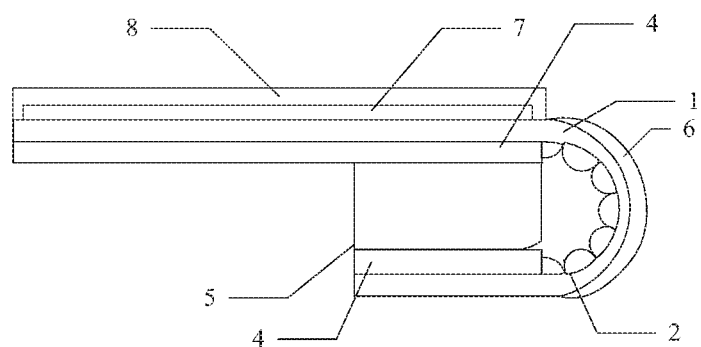

FIGS. 6a to 6c each are a schematic structural view of a display substrate according to an embodiment of the present disclosure. As shown in FIGS. 6a to 6c, in some embodiments, a display functional layer 7 and an encapsulation layer 8 may be sequentially disposed on the display portion along a light exit direction of the display substrate 1. The support layer 2 is provided on the inner side of the bendable portion B, and further, a protection layer 6 may be provided on the outer side of the bendable portion. The display functional layer 7 is an OLED light-emitting layer. A material of the encapsulation layer 8 mainly includes an inorganic substance. In one embodiment of the present disclosure, the encapsulation layer 8 may serve to prevent water and oxygen from contacting the OLED light-emitting layer, thereby protecting the OLED light-emitting layer. The support layers 2 in FIGS. 6b and 6c are the support layers 2 shown in FIGS. 2a and 3a, respectively, and details thereof are described above with respect to FIG. 2a in conjunction with FIG. 3a, and will not be described again here.

The embodiment of the present disclosure further provides a display device, which includes the aforementioned display substrate. The display device may also be provided with a flexible cover plate, and the flexible cover plate is provided on the display substrate along the light exit direction of the display substrate so as to protect the display substrate. The display device may be an electronic apparatus, such as a television, a mobile phone, a computer, a tablet computer, a handheld terminal and the like.

By adopting the display device according to the embodiment of the present disclosure, the support layer is provided on the inner side of the bendable portion of the display substrate, and when the bendable portion is pressed by external forces, the support layer may support the bendable portion to prevent the bendable portion from deforming. Further, the display device according to the embodiment of the present disclosure adopts the aforementioned display substrate, so that the display device may achieve the effect which may be achieved by the display substrate, and details are not repeated herein.

Figure 7:
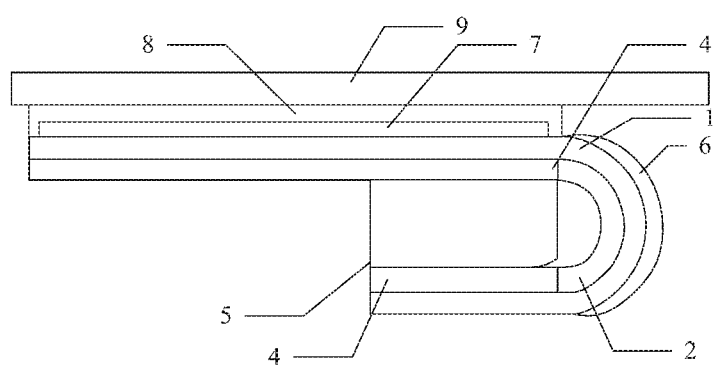
FIG. 7 is a schematic structural diagram of a display device according to an embodiment of the present disclosure.

FIG. 7 is a schematic structural diagram of a display device according to an embodiment of the present disclosure. As shown in FIG. 7, in some embodiments, the display device includes a display substrate 1. The display substrate 1 may include a display portion, a binding portion, and a bendable portion connected between the display portion and the binding portion. The binding portion is located on a side of the display portion distal to a light exit side of the display substrate. A display functional layer 7 and an encapsulation layer 8 may be sequentially disposed on the display portion along a light exit direction of the display substrate 1. The display device may also be provided with a flexible cover plate 9, and the flexible cover plate 9 is provided at the light exit side of the encapsulation layer 8. The material of the flexible cover plate 9 mainly includes polyimide. A support layer 2 is provided on the inner side of the bendable portion, and a protection layer 6 is provided on the outer side of the bendable portion. The support layer 2 includes a plurality of support strips 21 which extend along the bending axis 3. From one end (the top end of the support strips 21 in FIGS. 2b and 3b) of the support strips 21 distal to the bendable portion B to one end (the bottom end of the support strips 21 in FIGS. 2b and 3b) of the support strips 21 proximal to the bendable portion B, the width of the support strips 21 is gradually increased. Back films 4 are provided on both a side of the binding portion proximal to the display portion and a side of the display portion proximal to the binding portion. A spacer block 5 is provided between the two layers of back film. The spacer block 5 has a chamfer structure as shown in the figures.

In one embodiment of the present disclosure, the flexible cover plate 9 may be used to protect the light-emitting functional layer in the display device, and has functions of fingerprint prevention and scratch prevention.

It will be understood that, the above embodiments are merely exemplary to illustrate the principles of the present disclosure, and the present disclosure is not limited thereto. It will be apparent to those skilled in the art that various changes and modifications may be made therein without departing from the spirit and scope of the present disclosure, and these changes and modifications are to be considered within the scope of the present disclosure.

What is claimed is:

1. A display substrate comprising a display portion, a binding portion and a bendable portion between the display portion and the binding portion, wherein the binding portion is on a side of the display portion distal to a light exit side of the display substrate; wherein,
a support layer is on an inner side of the bendable portion, and the support layer extends from one end of the bendable portion close to the display portion to one end of the bendable portion close to the binding portion of the bendable portion and extends along an edge on the inner side of the bendable portion; and the bendable portion is bent around a bending axis;
wherein a cross-sectional shape of the bendable portion in a plane perpendicular to the bending axis is a partial circular ring, and an intersection point between the bending axis and the plane is a circle center of a circular ring where the bent bendable portion is located; and
cross-sectional shape of the support layer in a plane perpendicular to the bending axis is a partial circular ring which is bent around the bending axis.

2. The display substrate of claim 1, wherein the support layer covers an entire surface on the inner side of the bendable portion.

3. The display substrate of claim 2, wherein a material of the support layer comprises a curing adhesive cured by ultraviolet light UV.

4. The display substrate of claim 2, wherein the support layer comprises a plurality of support strips arranged along the edge on the inner side edge of the bendable portion from the one end of the bendable portion close to the display portion to the one end of the bendable portion close to the binding portion;
in a cross section of the support strips in a plane perpendicular to the bending axis, a width of each of the support strips is gradually increased from an end of the support strip proximal to the bending axis to an end of the support strip distal to the bending axis.

5. The display substrate of claim 4, wherein a cross-sectional shape of the support strip in a plane perpendicular to the bending axis is trapezoidal.

6. The display substrate of claim 4, wherein a cross-sectional shape of the support strip in a plane perpendicular to the bending axis is semicircular.

7. The display substrate of claim 1, further comprising a back film, wherein the back film comprises a first layer of back film on a surface of the display portion proximal to the binding portion and a second layer of back film on a surface of the binding portion proximal to the display portion, and at least one end of the support layer abuts against the back film.

8. The display substrate of claim 2, further comprising a back film, wherein the back film comprises a first layer of back film on a surface of the display portion proximal to the binding portion and a second layer of back film on a surface of the binding portion proximal to the display portion, and both ends of the support layer abut against the back film.

9. The display substrate of claim 7, wherein the end of the support layer abutting against the back film has a same thickness as the back film.

10. The display substrate of claim 8, wherein the end of the support layer abutting against the back film has a same thickness as the back film.

11. The display substrate of claim 7, further comprising a spacer block between the first layer of back film and the second layer of back film, wherein the spacer block is provided with a chamfer structure at one end of the spacer block proximal to the binding portion, and the chamfer structure is on one side of the spacer block proximal to the bendable portion.

12. The display substrate of claim 8, further comprising a spacer block between the first layer of back film and the second layer of back film, wherein the spacer block is provided with a chamfer structure at one end of the spacer block proximal to the binding portion, and the chamfer structure is on one side of the spacer block proximal to the bendable portion.

13. The display substrate of claim 11, wherein the chamfer structure is a circular bead of R0.5 to R1 or a 45 degree chamfer of C0.5 to C1.

14. The display substrate of claim 12, wherein the chamfer structure is a circular bead of R0.5 to R1 or a 45 degree chamfer of C0.5 to C1.

15. A display device comprising the display substrate of claim 1, and a flexible cover plate which is on the display substrate at a light exit side of the display substrate.

16. The display device of claim 15, wherein the support layer covers an entire surface on the inner side of the bendable portion.

* * * * *